(12) United States Patent
Steiner et al.

(10) Patent No.: US 11,258,464 B1
(45) Date of Patent: Feb. 22, 2022

(54) CODEWORD CONCATENATION FOR CORRECTING ERRORS IN DATA STORAGE DEVICES

(71) Applicant: Kioxia Corporation, Tokyo (JP)

(72) Inventors: Avi Steiner, Kiriat Motzkin (IL); Hanan Weingarten, Herzliya (IL)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/844,725

(22) Filed: Apr. 9, 2020

(51) Int. Cl.
*H03M 13/29* (2006.01)
*G06F 11/10* (2006.01)

(52) U.S. Cl.
CPC ..... *H03M 13/2909* (2013.01); *G06F 11/1068* (2013.01)

(58) Field of Classification Search
CPC .................................................. H03M 13/2909
USPC .................... 714/755, 752, 753, 757, 754
See application file for complete search history.

(56) References Cited

U.S. PATENT DOCUMENTS

| 2006/0056720 | A1* | 3/2006 | Chen | H04N 19/91 382/245 |
| 2009/0086815 | A1* | 4/2009 | Tian | H04N 19/124 375/240.03 |
| 2011/0004812 | A1* | 1/2011 | Yang | G06F 11/1048 714/782 |
| 2016/0274969 | A1* | 9/2016 | Chen | H03M 13/3746 |
| 2019/0190653 | A1* | 6/2019 | Langhammer | H04L 1/0058 |

* cited by examiner

*Primary Examiner* — Fritz Alphonse
(74) *Attorney, Agent, or Firm* — Foley & Lardner LLP

(57) ABSTRACT

Various implementations described herein relate to systems and methods for encoding and decoding data having input payload stored in a non-volatile storage device, including encoding the input payload by concatenating a plurality of short codewords to generate a plurality of encoded short codewords, and decoding the plurality of encoded short codewords to obtain the data, where each of the plurality of short codewords corresponding to a portion of the input payload.

18 Claims, 11 Drawing Sheets

CODEWORD CONCATENATION FOR CORRECTING ERRORS IN DATA STORAGE DEVICES

TECHNICAL FIELD

The present disclosure relates generally to systems and methods for using codeword concatenation to correct errors in data storage devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP).

A code rate is defined by a ratio of information content (referred to as a "payload") of a codeword to an overall size of the codeword. For example, for a code that contains k bits and r redundancy bits, the code rate $R_c$ is defined by $$R_c = \frac{k}{k+r}.$$

Conventional encoding methods are not well suited to support codes having high code rates for both hard decoding and soft decoding. For example, conventional low-density parity-check (LDPC) codes that have high code rates (e.g., 0.9) have considerably long code length, resulting in complex and costly implementations.

SUMMARY

In certain aspects, the present implementations are directed to encoding and decoding data having input payload stored in a non-volatile storage device by encoding the input payload by concatenating a plurality of short codewords to generate a plurality of encoded short codewords, each of the plurality of short codewords corresponding to a portion of the input payload, and decoding the plurality of encoded short codewords to obtain the data.

In some aspects, the present implementations are directed to an error correction system that includes a processing circuit configured to encode and decode data having input payload stored in a non-volatile storage device by encoding the input payload by concatenating a plurality of short codewords to generate a plurality of encoded short codewords, each of the plurality of short codewords corresponding to a portion of the input payload and decoding the plurality of encoded short codewords to obtain the data.

In some aspects, the present implementations are directed to a non-transitory computer-readable medium storing computer-readable instructions, such that when executed, causes a processing circuit to encode an input payload by concatenating a plurality of short codewords to generate a plurality of encoded short codewords, each of the plurality of short codewords corresponding to a portion of the input payload and decode the plurality of encoded short codewords to obtain the data.

DETAILED DESCRIPTION

Figure 1:
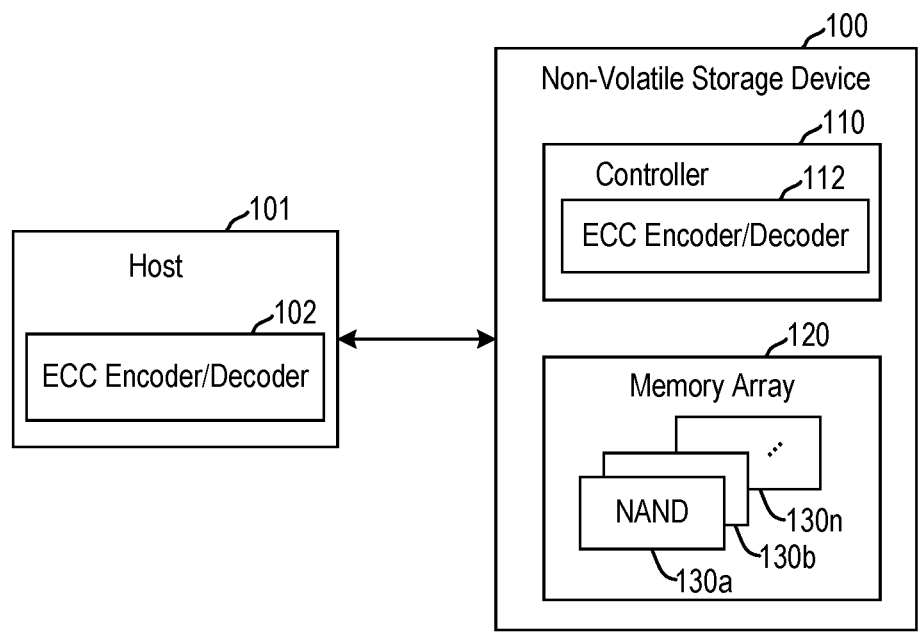
FIG. 1 shows a block diagram of examples of a system including a non-volatile storage device and a host, according to some implementations.

The theoretical limit of ECC decode capability depend on the codeword size. A decoder using a codeword having a larger size has a higher likelihood of success in correcting higher input bit error rate (BER). That is, a codeword having a larger codeword size has a decode capability that is better than that of another codeword having a smaller codeword size, at high BER. However, a longer codeword typically require more hardware cost and has more impact on performance. Thus, it may be challenging to use longer codewords in ECC schemes implemented in some systems (e.g., a NAND flash memory) in which ECC decoder implementation hardware cost is limited, and high performance (e.g., read and write throughput) is preferred. With respect to read performance, for every host read command, data associated with the long codeword has to be read from the NAND flash memory and then decoded. In an example in which a long codeword of 64 KB is used, and the basic host command size is 4 KB, the controller of the NAND flash memory has to read 16 times of the bits of the basic host command size from the NAND flash memory and perform a decode operation on 64 KB of the codeword, only output merely 4 KB of data to the host. Accordingly, using a long codeword is a very costly operation, with considerable impact on the performance and power consumption of the hardware.

Traditionally, encoding using a long codeword includes using a selected encoding scheme to encode a long input payload according to coding guidelines that maximize reliability, under predetermined decoding complexity limitations. For example, the encoding scheme can be used for the complete input codeword size of the long input payload. For example, the encoding scheme is used in computing cyclic redundancy check-sum (CRC) on the input bits of the long input payload and then in computing the redundancy bits for each component code as mapped on the long codeword. In one example in which an input payload has a size of 64 KB, a CRC can be computed on all of the input payload bits. All of the input payload bits and the CRC bits are encoded together according to the encoding scheme and code rate to determine the redundancy bits.

Arrangements disclosed herein relate to systems, apparatuses, methods, and non-transitory computer-readable media for providing storage devices with improved endurance and reliability by implementing a codeword concatenation scheme for ECC. Examples of such storage devices include but are not limited to, flash memory devices, e.g., quad-level cell (QLC) NAND flash memory devices, and so on. The codeword concatenation scheme described herein benefits from the high reliability, ready performance, and endurance of a long codeword while adding an insignificant penalty to performance. The codeword concatenation scheme can be implemented using half product codes (e.g., half folded-product code (HFPC), which enables high code when deployed in NAND flash memory devices). In some examples, the codeword concatenation scheme employs one or more of partial decoding, successive decoding, or joint decoding to optimize the read performance throughput and max latency.

In some arrangements, a long codeword is encoded by concatenating multiple short codewords. Each of the short codewords is also decoded. Although each short codeword has lower error correction reliability than the reliability of a longer codeword, by concatenating multiple short codewords to generate a long codeword, higher error correction reliability typically associated with long codewords can be achieved. On the other hand, by successive decoding short codewords, the benefits of short codewords can be maintained.

The codeword concatenation scheme leverages characteristics of a very-long codeword to provide high error correction capabilities for hard decoding (e.g., hard input to the decoder) and soft decoding (e.g., soft input to the decoder). In particular, the codeword concatenation scheme can correct high BER with hard or soft decoding. The codeword concatenation scheme can enable improved encoding/decoding throughput and efficiency with low implementation complexity for both hard input or soft input to the decoder. The codeword concatenation scheme can further leverage partial decoding capabilities to provide high reliability.

In some arrangements, the codeword concatenation scheme refers to generating a long codeword by concatenating multiple shorter sized codewords. Each short codeword uses an encoding scheme includes one or more of efficient standalone, partial, and successive decoding capabilities, efficient concatenation with other short codewords, or low complexity decoding. In some arrangements, the codeword concatenation scheme allows efficient hardware implementation, for example by having low power consumption.

In some arrangements, the codeword concatenation scheme has improved flexibility for read-flow to optimize latency, as function of decode complexity. For instance, for a low to medium BER range (corresponding to mid-range stress conditions), the read flow performs partial read of only short codewords, thus having no impact on performance. For a high BER range (corresponding to high stress conditions, such as those in which maximal read disturb or retention is present), the read flow performs successive decoding. Successive decoding refers to sequential reading and decoding of preceding, shorter codewords, decoding each shorter codeword, and then decoding the target short codeword. For a very high BER range (corresponding to very high stress conditions), the read flow performs reading of all short codewords and joint iterative decoding of all the short codewords.

To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices $130a$-$130n$. Each of the NAND flash memory devices $130a$-$130n$ includes one or more individual NAND flash dies, which are non-volatile memory (NVM) capable of retaining data without power. Thus, the NAND flash memory devices $130a$-$130n$ refer to multiple NAND flash memory devices or dies within the flash memory device 100. Each of the NAND flash memory devices $130a$-$130n$ includes one or more dies, each of which has one or more planes. Each plane has multiple blocks, and each block has multiple pages.

While the NAND flash memory devices $130a$-$130n$ are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some implementations, the ECC encoders of the ECC encoder/decoder 102 are configured to encode data (e.g. input payload) to be written to multiple instances of the non-volatile storage device 100 using a redundancy code, examples including, but not limited to, erasure codes and RAID levels 0-6.

Figure 2:
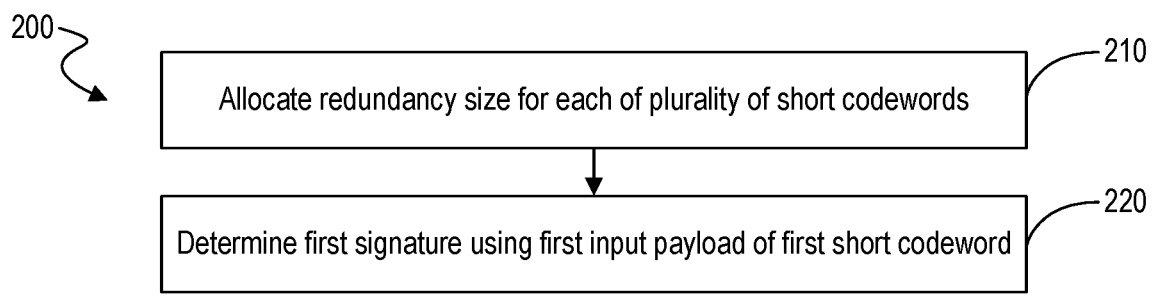
FIG. 2 is a process flow diagram illustrating an example encoding/decoding method, according to some implementations.

FIG. 2 is a process flow diagram illustrating an example method 200 for encoding and decoding data to be stored or stored in a non-volatile storage device (e.g., the non-volatile storage device 100 of FIG. 1), according to some implementations. Referring to FIGS. 1-2, the method 200 can be performed by the ECC encoder/decoder 102 (e.g., by the host 101) or the ECC encoder/decoder 112 (e.g., by the controller 110).

At 210, the ECC encoder/decoder 102 or 112 encodes the input payload (e.g., the data) by concatenating a plurality of short codewords to generate a plurality of encoded short codewords. Each of the plurality of short codewords corresponds to a portion of the input payload. After the input payload is encoded at 210, the controller 110 can store the encoded input payload (e.g., the plurality of short codewords) in the memory array 120. In that regard, block 210 can be a part of a write operation in which data corresponding to the input payload is stored in the memory array 120.

At 220, the ECC encoder/decoder 102 or 112 decodes the plurality of encoded short codewords to obtain the data. The plurality of short codewords are read from the memory array 120 before the plurality of short codewords are decoded. In that regard, block 220 can be a part of a read operation in which data corresponding to the short codewords are read from the memory array 120 by the host 101.

Figure 6:
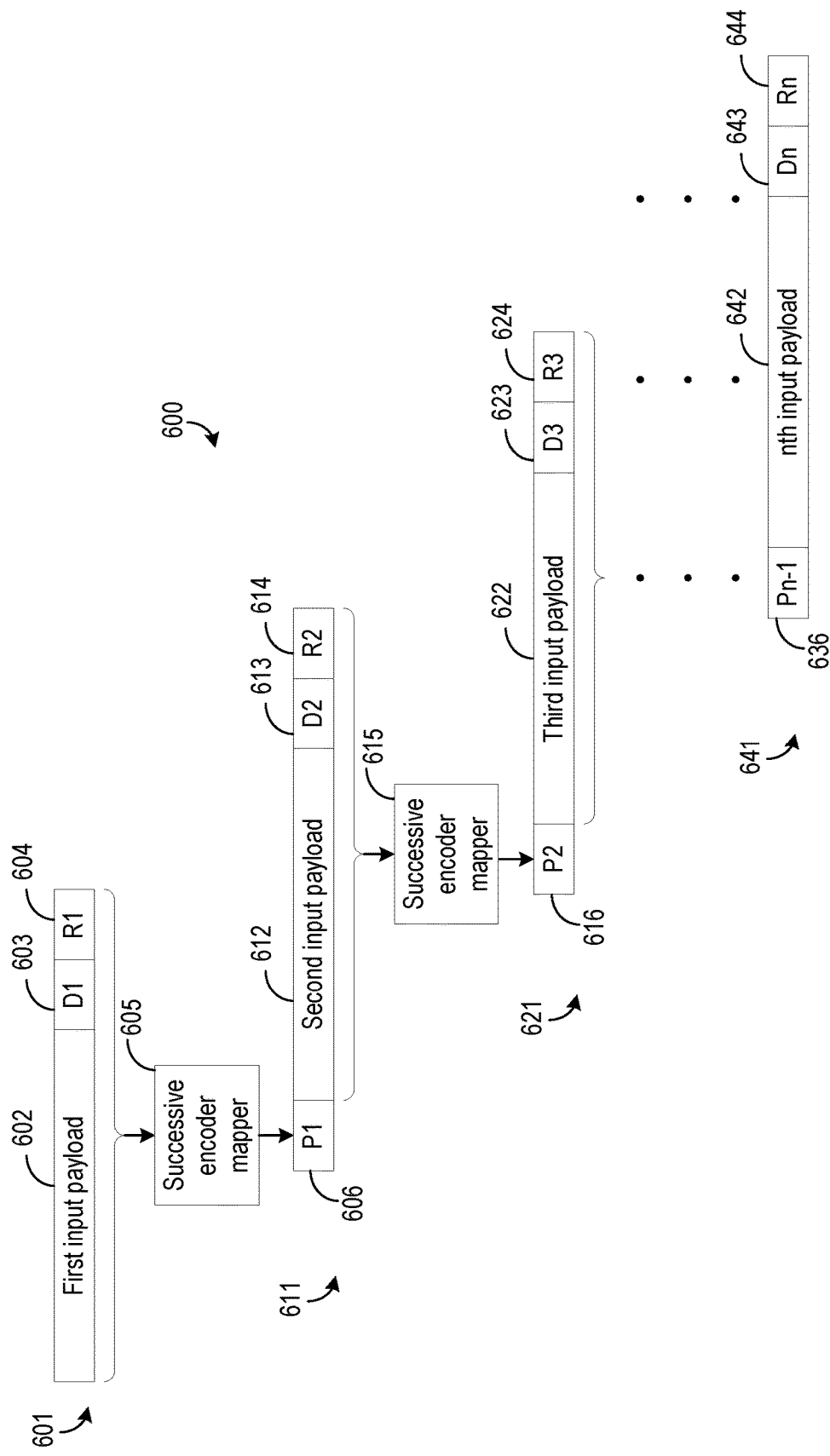
FIG. 6 is a diagram illustrating an example codeword structure used for the encoding method of FIG. 5, according to some implementations.
Figure 8:
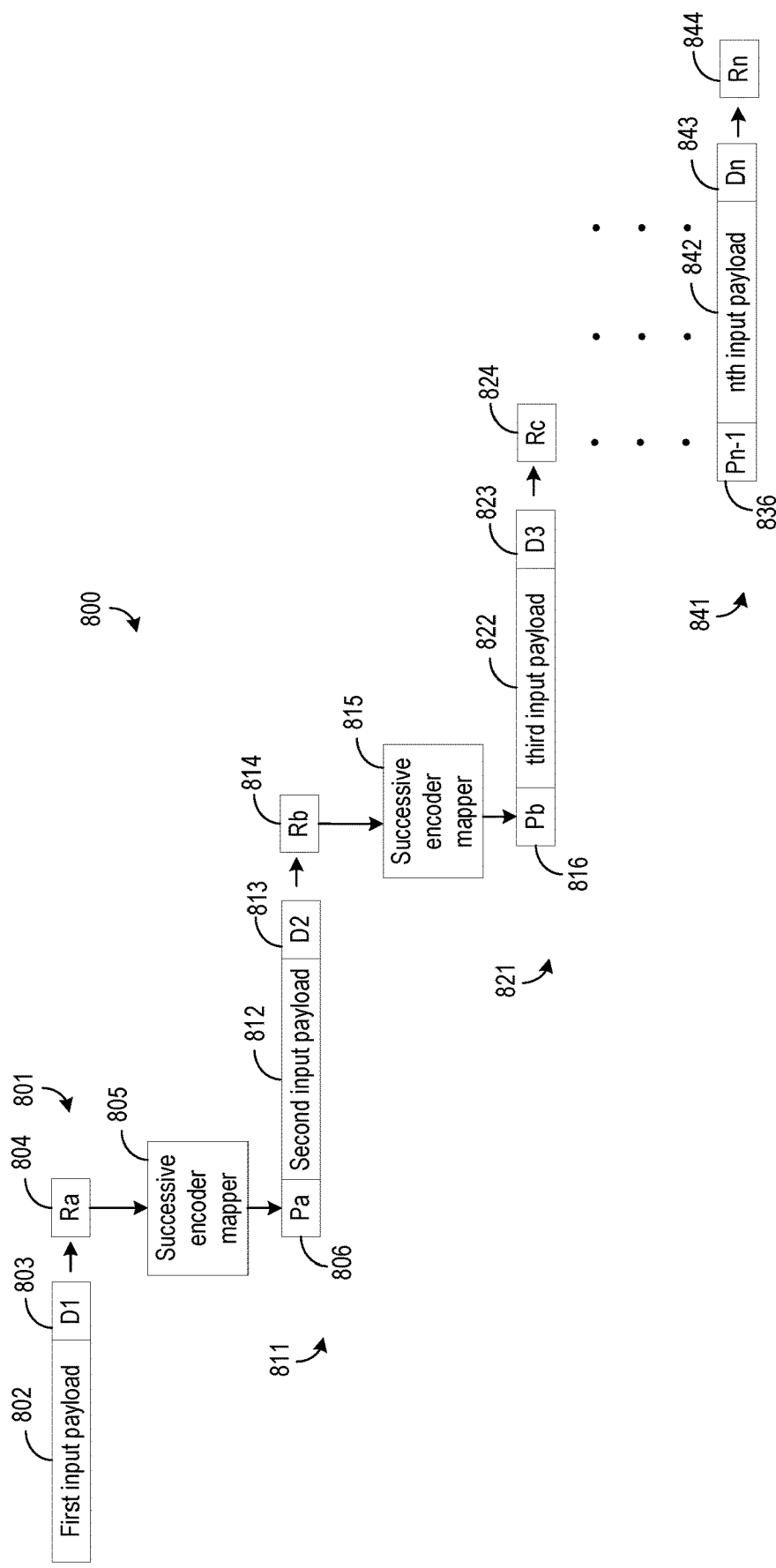
FIG. 8 is a diagram illustrating an example codeword structure used for the encoding method of FIG. 7, according to some implementations.

In some arrangements, the encoding scheme disclosed herein allows several degrees of freedom for decoding because each of the plurality of short codewords contains a signature (e.g., D1 603, D2, 613, D3 623, . . . , and Dn 643 of FIG. 6, D1 803, D2, 813, D3 823, . . . , and Dn 843 of FIG. 8, and so on) determined for a corresponding input payload (e.g., the input payloads 602, 612, 622, . . . , 642 of FIG. 6, the input payloads 802, 812, 822, . . . , 842 of FIG. 8, and so on). Therefore, in some arrangements, each of plurality of short codewords can be successfully decoded without relying on another codeword.

In some arrangements, decoding at 220 includes one or more of various decoding methods, including partial decoding, successive decoding, joint decoding, and so on. In some arrangements, decoding at 220 includes decoding the plurality of short codewords using a first decoding method (e.g., partial decoding) of the decoding methods.

An encoding scheme such as the HFPC encoding scheme can be used to encode each of the plurality of short codewords. In some arrangements, the HFPC code structure is composed of multiple component codes. Each component code can be, for example, a Bose-Chaudhuri-Hocquenghem (BCH) code. A number of components code n can be determined by the correction capability of each component code and code rate. For example, given a minimum distance $D_{min}$ per component code, the correction capability t of each component code can be represented by:

$$t = (D_{min}-1)/2 \qquad (1);$$

where the $D_{min}$, of a linear block code is defined as the smallest Hamming distance between any pair of code vectors in the code. The number of redundancy bits r can be represented by:

$$r = Q \cdot (D_{min}-1)/2 \qquad (2),$$

where Q is a Galois field parameter for the BCH component code defined over GF ($2^Q$). Given a code rate R and payload length K bits, a number of component codes needed can be determined by:

$$n = \left\lfloor K \cdot \frac{1-R}{r \cdot R} \right\rfloor; \text{ or} \qquad (3)$$

$$n = \left\lfloor 2K \cdot \frac{1-R}{Q \cdot (D_{min}-1) \cdot R} \right\rfloor. \qquad (4)$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 3:
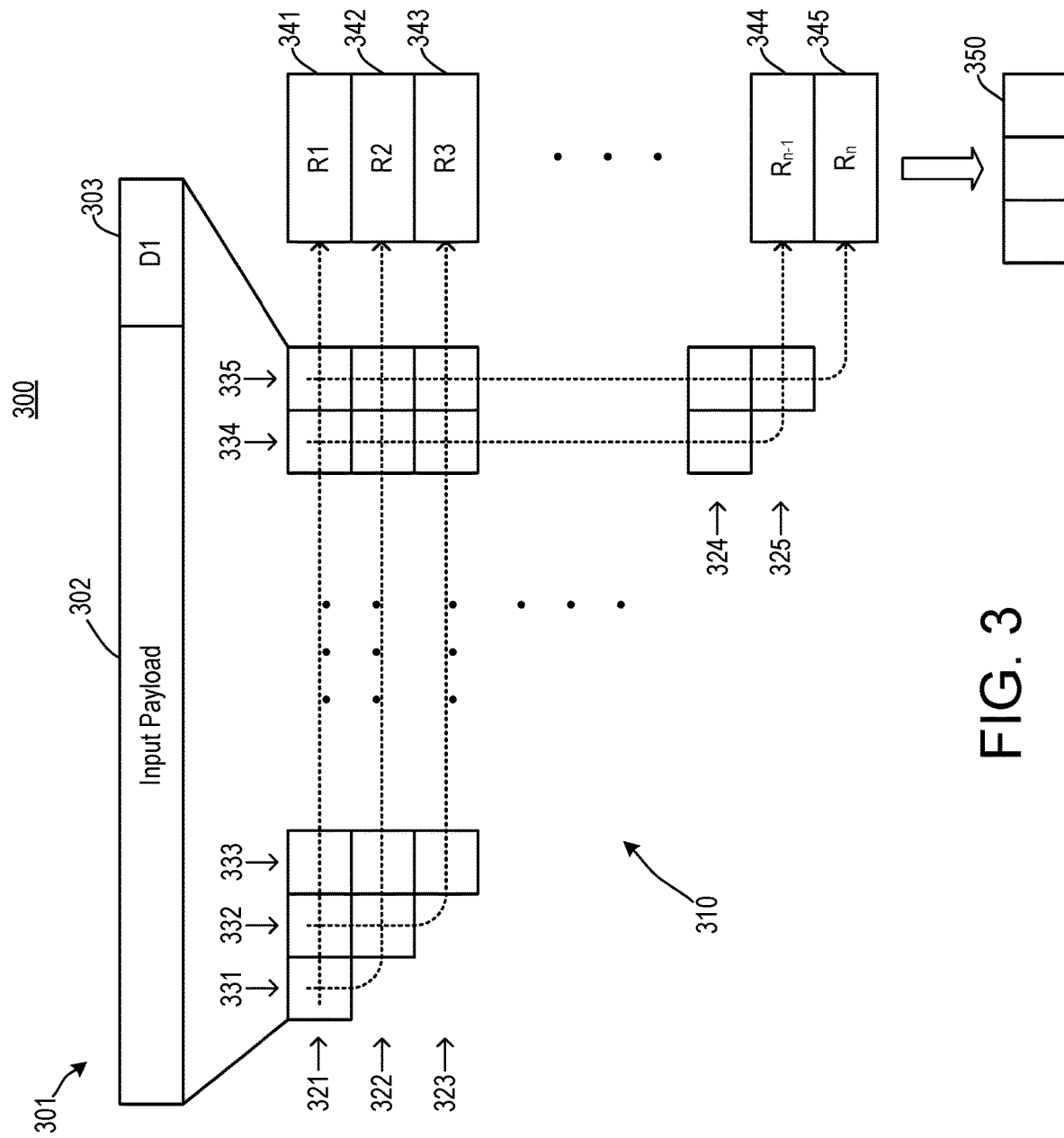
FIG. 3 is a diagram illustrating a mapping in an encoding process using a half folded-product code (HFPC) structure according to various implementations.

FIG. 3 is a diagram illustrating a mapping 300 in an encoding process using a HFPC structure according to various implementations. Referring to FIGS. 1-3, the mapping 300 corresponds to the HFPC encoding scheme. The controller 110 (e.g., one or more ECC encoders of the ECC encoder/decoder 112) or the host 101 (e.g., one or more ECC encoders of the ECC encoder/decoder 102) can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. In some examples, the input payload 302 includes information bits and redundancy bits introduced by the host 101 for RAID or erasure encoding (e.g. by the one or more ECC encoders of the ECC encoder/decoder 102). As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one arrangement, the mapping is a one to one mapping, where each bit of the input bits 301 is mapped to one bit of the pseudo triangular matrix 310 and the total number of bits in the pseudo triangular matrix 310 is equal to the number of input bits 301. In another arrangement, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to the right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335). Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 into a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn−1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the codeword. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIG. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the codeword and resulting in improved correction capabilities (as applied to iterative decoding).

The redundancy bits R1 341-Rn−m 345 generated from the HFPC encoding process described with respect to FIG. 3 can be encoded by another, separate set of component codes used to encode all or a subset of these redundancy bits by another set of code components. This forms a folded product code encoding over the redundancy bits R1 341-Rn−m 345, which, together with the information bits encoding, results in a low complexity encoding process.

As shown, the bits for each component code depend on the bits for another component code during decoding in the ECC structure corresponding to the mapping 300. In other implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 4:
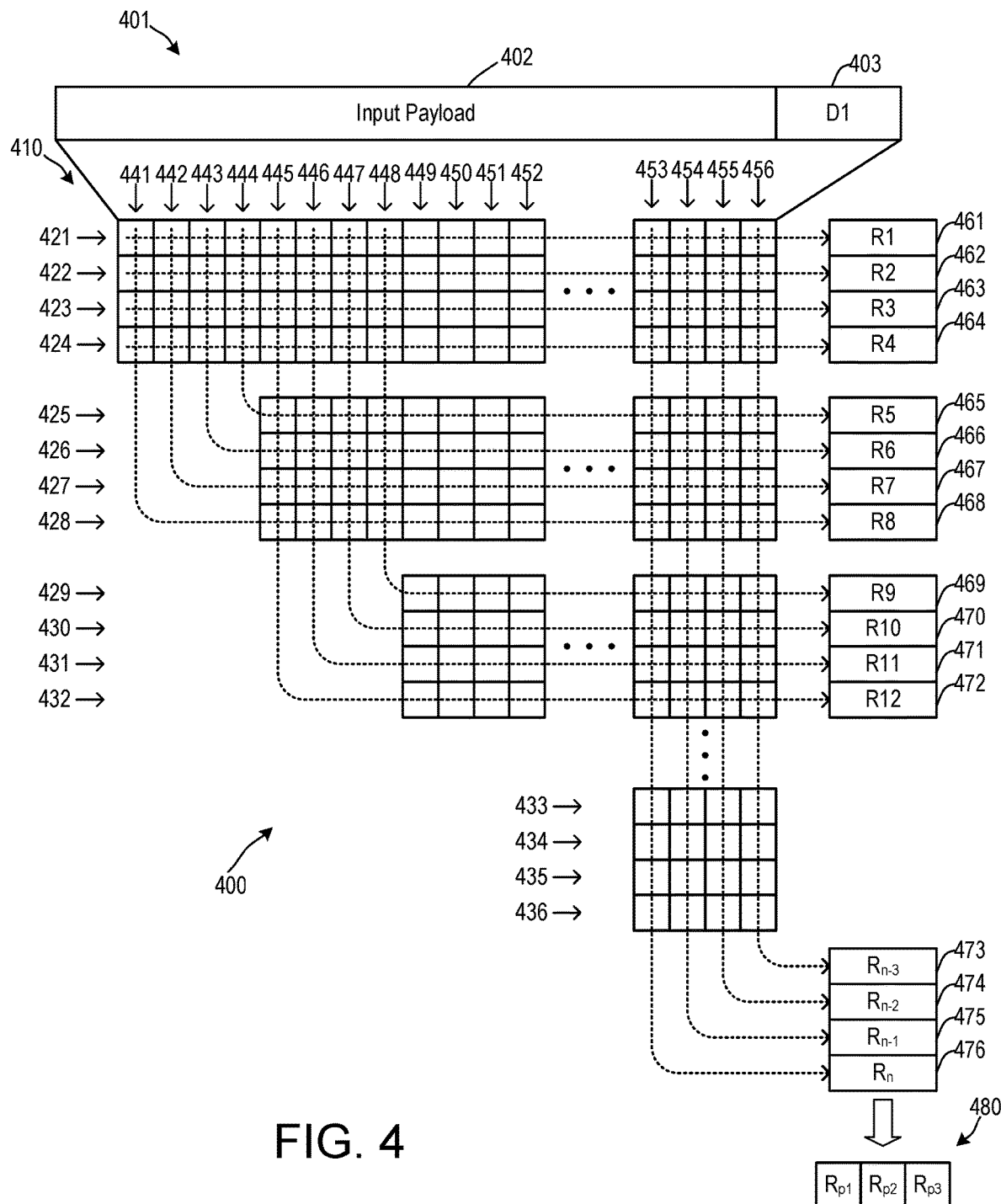
FIG. 4 is a diagram illustrating a mapping in an encoding process using a group HFPC structure according to various implementations.

In that regard, FIG. 4 is a diagram illustrating a mapping 400 in an encoding process using a group HFPC structure according to various implementations. Referring to FIGS. 1-4, the mapping 400 corresponds to the group HFPC encoding scheme. The HFPC interleaver of controller 110 (e.g., one or more ECC encoders of the ECC encoder/decoder 112) or the host 101 (e.g., one or more ECC encoders of the ECC encoder/decoder 102) is configured to organize (e.g., interleave) input bits 401 into a form of a pseudo triangular matrix 410. The input bits 401 includes input payload 402 and signature bit(s) D1 403 in some examples. The input payload 402 includes the information bits. As described, an example of D1 403 is the extra CRC bits (outer parity bits). The mapping from the input bits 401 to the pseudo triangular matrix 410 is maintained by the controller 110.

As shown, the pseudo triangular matrix 410 has an upper triangular form, which has rows 421-436 (with rows between rows 432 and 433 omitted for clarity) and columns 441-456 (with columns between columns 452 and 453 omitted for clarity). The pseudo triangular matrix 410 is shown to have multiple blocks. Each block in the pseudo triangular matrix 410 includes or otherwise represents two or more bits of the input bits 401. The number of input bits per each block can be predetermined and equal for all the blocks of the pseudo triangular matrix 410. The disclosed implementations allow intersection of two or more common bits for any pair of component codes.

In some implementations, the input bits 401 are mapped to blocks in the pseudo triangular matrix 410 consecutively (by any suitable order). For example, the rows 421-436, in that order or in a reverse order, can be filled by the input bits 401 consecutively block-by-block, from the left-most block of a row to a right-most block of a row, or vice versa. In another example, the columns 441-456, in that order or in a reverse order, can be filled by the input bits 401 consecutively block-by-block, from the top-most block of a column to a bottom-most block of a row, or vice versa. In some implementations, the input bits 401 are mapped to the pseudo triangular matrix 410 pseudo-randomly. In other implementations, the input bits 401 can be mapped to the pseudo triangular matrix 410 using another suitable mapping mechanism.

The blocks, rows, and columns in the pseudo triangular matrix 410 can be grouped together. For example, the pseudo triangular matrix 410 includes a first group of columns 441-444, a second group of columns 445-448, a third group of columns 449-452, . . . , and another group of columns 453-456. The pseudo triangular matrix 410 includes a first group of rows 421-424, a second group of rows 425-428, a third group of rows 429-432, . . . , and another group of rows 433-436. Thus, the HFPC structure is divided into groups of 4 component codes. Every 4 component codes are encoded according to HFPC guidelines. Although 4 component code groups (e.g., 4 rows/columns) are shown in FIG. 4, any number (e.g., 2, 3, 6, 8, 10, 12, 16, and so on) of component codes can be grouped together.

As shown, the upper triangular form has a same number of columns and a same number of rows. The rows (e.g., the rows 421-424) or columns (e.g., the columns 441-444) in a same component code group have a same number of blocks and therefore have a same number of bits. In the upper triangular form, the rows 421-424 contain the most bits out of all the rows in the pseudo triangular matrix 410. Each of the rows 425-428 has one less group of blocks (4 blocks, corresponding to the group of columns 441-444) than any of the rows 421-424. Each of the rows 429-432 has one less group of blocks (4 blocks, corresponding to the group of columns 445-448) than any of the rows 425-428, and so on. Each of the rows 433-436, being the lowest row, has a group of blocks (e.g., 4 blocks). In other words, any row in the pseudo triangular matrix 410 (except for the rows 421-424) has 4 blocks less than a row of a group immediately above. Similarly, in the upper triangular form, each of the columns 441-444, being one of the left-most columns, has a group of blocks (e.g., 4 blocks). Each of the columns 445-448 has one more group of blocks (4 blocks, corresponding to the group of rows 425-428) than any of the columns 441-444. Each of the columns 449-452 has one more group of blocks (4 blocks, corresponding to the group of rows 429-432) than any of the columns 445-448, and so on. Each of the columns 453-456, being the right-most columns, has the most number of blocks. In other words, any column in the pseudo triangular matrix 410 (except for the columns 453-456) has 4 blocks less than a column of a group immediately to the right.

Organizing or mapping the input bits 401 in the upper triangular form of the pseudo triangular matrix 410 allows every component code to be associated with bits in a row and a column that have the same size or nearly the same size in the manner described. The component codes within a same group encode separate sets of the input bits 401 and are independent of each other.

R1 461-R4 464 are redundancy bits determined based on a same group of component codes. R1 461 represents redundancy bits corresponding to a first component code and are obtained by encoding (e.g., folded component encoding) the input bits 401 in a first row (e.g., the bits in the row 421). R2 462, R3 463, and R4 464 represent redundancy bits corresponding to additional component codes and are obtained by encoding (e.g., folded component encoding) the input bits 401 in the bits in the rows 422, 423, and 423, respectively. The bits used to determine each of R1 461-R4 464 do not overlap, and thus R1 461-R4 464 are independently determined.

R5 465, R6 466, R7 467, and R8 468 represent redundancy bits corresponding to additional component codes and are obtained by encoding (e.g., folded component encoding) the input bits 401 in the bits in the column 444 and row 425, in the column 443 and row 426, in the column 442 and row 427, and in the column 441 and row 428, respectively. The bits used to determine each of R5 465-R8 468 do not overlap, and thus R5 465-R8 468 are independently determined.

R9 469, R10 470, R11 471, and R12 472 represent redundancy bits corresponding to additional component codes and are obtained by encoding (e.g., folded component encoding) the input bits 401 in the bits in the column 448 and row 429, in the column 447 and row 430, in the column 446 and row 431, and in the column 445 and row 432, respectively. The bits used to determine each of R9 469-R12 472 do not overlap, and thus R9 469-R12 472 are independently determined.

This process continues until Rn−3 473, Rn−2 474, Rn−1 475, and Rn 476 are determined. Rn−3 473, Rn−2 474, Rn−1 475, and Rn 476 represent redundancy bits corresponding to additional component codes and are obtained by encoding (e.g., folded component encoding) the input bits 401 in the bits in the column 456, in the column 455, in the column 454, and in the column 453, respectively. The bits used to determine each of Rn−3 473, Rn−2 474, Rn−1 475, and Rn 476 do not overlap, and thus Rn−3 473, Rn−2 474, Rn−1 475, and Rn 476 are independently determined. An example of the folded component encoding is folded BCH encoding.

In the special case that the component codes are divided into two groups of independent component codes, the resulting coding scheme degenerates to a folded product code.

In other words, according to the mapping 400, the input bits 401 are mapped to the component codes of the ECC and are encoded as the mapped component codes. For example, the encoding process organizes or maps the input bits 401 in a matrix (e.g., a pseudo triangular matrix form), and performs folded BCH encoding for every component code. Each of the input bits 401 is encoded by two component codes of different component code groups. Thus, any component code intersects with all other component codes that are in the same group as the group to which that component code belongs. For component codes that encode the input bits 401, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 469 redundancy bits are also encoded by other component codes corresponding to R1 461-R8 468 and R11-Rn 476 that are not in the group in which the component code corresponding to R9 469 redundancy bits belongs. Each block of bits encoded by any of the component code (e.g., the component code corresponding to the R9 469) is encoded by that component code (e.g., the component code corresponding to the R9 469) and no more than another one of the component codes, hence in a non-overlapping manner. As such, every component code is mutually dependent on all other component codes that are not within the same group. The component codes together provide the encoding of each input bits 401 using two component codes.

In some implementations, parity bits can be generated via parity encoding. For example, folded parity encoding can be used to encode at least a portion of each of R1 461-Rn 476 into another component code (e.g., a folded product code 480, which is a set of packets). The folded product code 480 (e.g., having Rp1-Rp3) is the parity bits. This method of generating the parity bits can be efficient for obtaining simple hardware encoding implementations of HFPC, as the method can be iteratively decoded using various methods of hard or soft decoding.

Figure 5:
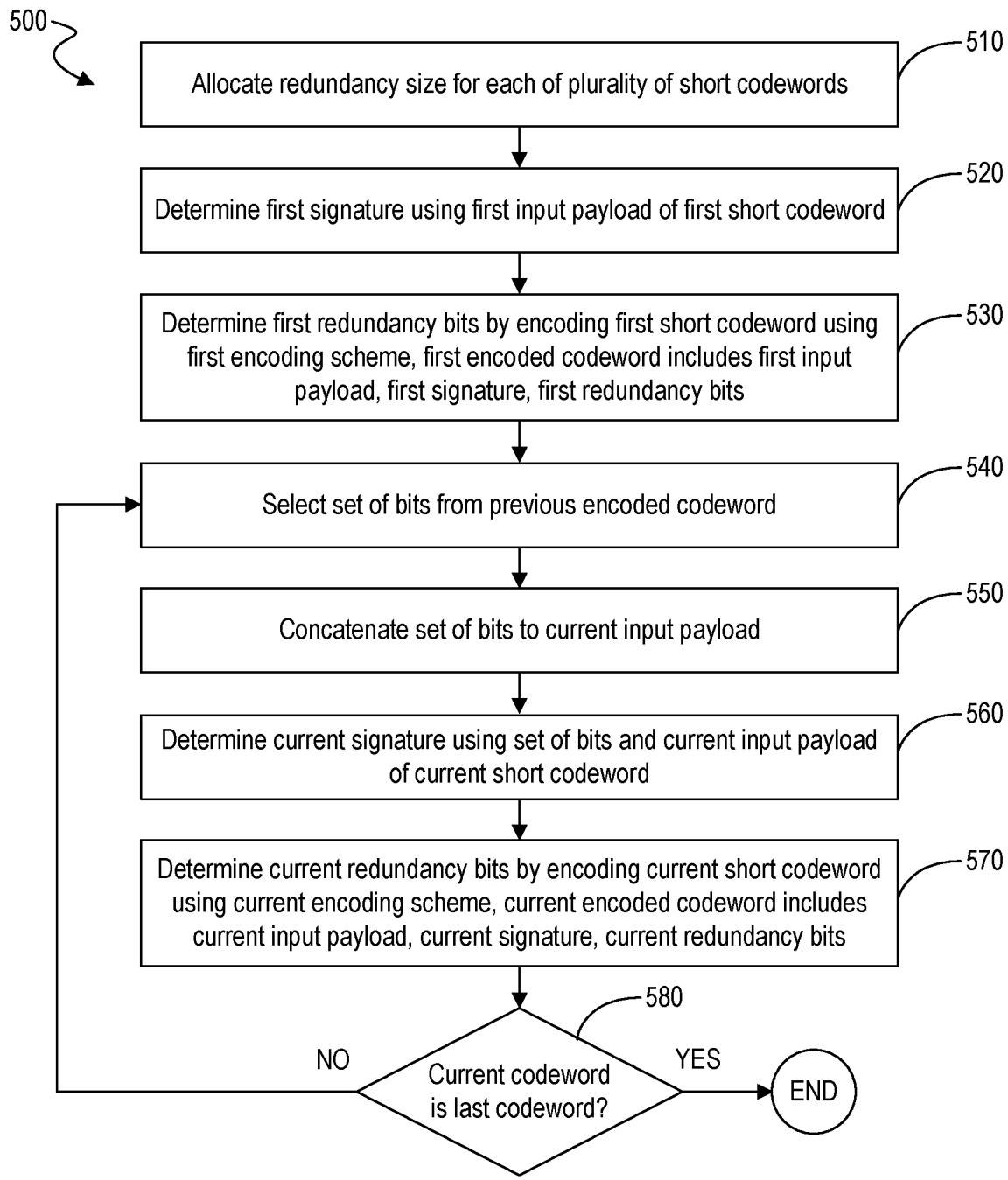
FIG. 5 is a process flow diagram illustrating an example encoding method, according to some implementations.

In some arrangements, an encoded long codeword can be determined by performing sequentially concatenated encoding of short codewords. In that regard, FIG. 5 is a process flow diagram illustrating an example encoding method 500, according to some implementations. FIG. 6 is a diagram illustrating an example codeword structure 600 used for the encoding method 500 of FIG. 5, according to some implementations. Referring to FIGS. 1-6, the encoding method 500 is an example implementation of block 210, and can be performed by one or more encoders of the encoder/decoder 102 or 112.

At 510, the ECC encoder/decoder 102 or 112 allocates redundancy size for each of a plurality of short codewords. The redundancy size of a codeword refers to a size of the codeword or a size of an input payload of that codeword. In some implementations, the redundancy size for each of the plurality of short codewords depends on a total redundancy size available for the long codeword intended to be generated or otherwise approximated by the concatenation of the plurality of short codewords. In one example, the redundancy size (e.g., 4 KB) for each of the plurality of short codewords is a total redundancy size (e.g., 16 KB) of the long codeword divided by a number n (e.g., 4) of the plurality of short codewords. Accordingly, a total input payload is encoded by the plurality of short codewords, with each short codeword encoding a portion of the input payload. As shown in the codeword structure 600, the total input payload is the sum of a first input payload 602, a second input payload 612, a third input payload 622, . . . , an nth input payload 642. Each of the input payloads 602, 612, 622, . . . , and 642 includes information bits. The long codeword corresponds to the concatenated plurality of short codewords.

At 520, the ECC encoder/decoder 102 or 112 determines a first signature (e.g., signature bit(s) D1 603) using the first input payload 602 of a first short codeword of the plurality of short codewords. The first short codeword includes the first input payload 602 and the signature bit(s) D1 603. An example of D1 603 is extra CRC bits.

At 530, the ECC encoder/decoder 102 or 112 determines first redundancy bits R1 604 by encoding the first short codeword using a first encoding scheme. Examples of the first encoding scheme include but are not limited to, the HFPC encoding scheme described herein, or another suitable encoding scheme. In that regard, a first encoded short codeword 601 includes the first input payload 602, D1 603, and R1 604.

At 540, the ECC encoder/decoder 102 or 112 selects, from a previous encoded short codeword (e.g., the first encoded short codeword 601), a set of bits (e.g., a first set of bits P1 606). In one example, the ECC encoder/decoder 102 or 112 can include a fixed mapper or a successive encoder mapper 605 to select P1 606. In some examples, the fixed mapper or a successive encoder mapper 605 is a bit-selection look-up-table (LUT) configured to choose a portion (e.g., one or more bits such as P1 606) from an input (e.g., R1 604) and output the chosen portion.

At 550, the ECC encoder/decoder 102 or 112 concatenates the sets of bits (e.g., P1 606) to a current input payload (e.g., the second input payload 612) of a current (second) short codeword of the plurality of short codewords.

At 560, the ECC encoder/decoder 102 or 112 determines a current (second) signature (e.g., signature bit(s) D2 613) using the sets of bits (e.g., P1 606) and the current input payload (e.g., the second input payload 612). The second short codeword includes the second input payload 612 and D2 613.

At 570, the ECC encoder/decoder 102 or 112 determines current (second) redundancy bits (e.g., the redundancy bits R2 614) by encoding the current (second) short codeword using a current (second) encoding scheme. Examples of the second encoding scheme include but are not limited to, the HFPC encoding scheme described herein, or another suitable encoding scheme. In that regard, in some arrangements, a current (second) encoded short codeword 611 includes the second input payload 612, D2 613, and R2 614. In other arrangements, the current (second) encoded short codeword 611 includes the second input payload 612, D2 613, and R2 614, as well as P1 606.

At 580, the ECC encoder/decoder 102 or 112 determines whether the current codeword is the last codeword of the plurality of codewords. In response to determining that the current codeword is not the last codeword (B580:NO), the method 500 returns to block 540. On the other hand, in response to determining that the current codeword is the last codeword (B580:YES), the method 500 ends.

In the example in which the current codeword is the second codeword (B580:NO), at 540, the ECC encoder/decoder 102 or 112 selects, from a previous encoded short codeword (e.g., the second encoded short codeword 611), a set of bits (e.g., a second set of bits P2 616). In one example, the ECC encoder/decoder 102 or 112 can include a fixed mapper or a successive encoder mapper 615 to select P2 616. At 550, the ECC encoder/decoder 102 or 112 concatenates the sets of bits (e.g., P2 616) to a current input payload (e.g., the third input payload 622) of a current (third) short codeword of the plurality of short codewords. At 560, the ECC encoder/decoder 102 or 112 determines a current (third) signature (e.g., signature bit(s) D3 623) using the sets of bits (e.g., P2 616) and the current input payload (e.g., the third input payload 622). The third short codeword includes the third input payload 622 and D3 623. At 570, the ECC encoder/decoder 102 or 112 determines current (third) redundancy bits (e.g., the redundancy bits R3 624) by encoding the current (third) short codeword using a current (third) encoding scheme. Examples of the third encoding scheme include but are not limited to, the HFPC encoding scheme described herein, or another suitable encoding scheme. In that regard, in some arrangements, a current (third) encoded short codeword 621 includes the third input payload 622, D3 623, and R3 624. In other arrangements, the current (third) encoded short codeword 621 includes the third input payload 622, D3 623, and R3 624, as well as P2 616.

In the example in which the current codeword is the nth short codeword (B580:YES), the method 500 ends. The nth short codeword includes the nth input payload 642 and signature bit(s) Dn 643. Dn 643 is determined using the nth input payload 642 concatenated with the sets of bits Pn−1 636 in the manner described. Pn−1 636 can be selected the by a fixed mapper or a successive encoder mapper of the ECC encoder/decoder 102 or 112 from previous encoded short codeword, e.g., the (n−1)th encoded short codeword. An example of Dn 643 is extra CRC bits. Redundancy bits Rn 644 is determined by encoding the nth short codeword using a nth encoding scheme. Examples of the nth encoding scheme include but are not limited to, the HFPC encoding scheme described herein, or another suitable encoding scheme. In that regard, in some arrangements, an nth encoded short codeword 641 includes the nth input payload 642, Dn 643, and Rn 644. In other arrangements, the nth encoded short codeword 641 includes nth input payload 642, Dn 643, and Rn 644, as well as Pn−1 636.

Each of the plurality of short codewords has a different code rate. The first codeword has the lowest code rate. The second codeword has a code rate higher than that of the first codeword. The third codeword has a code rate higher than that of the second codeword. The nth codeword has the highest code rate among the plurality of codewords.

Figure 7:
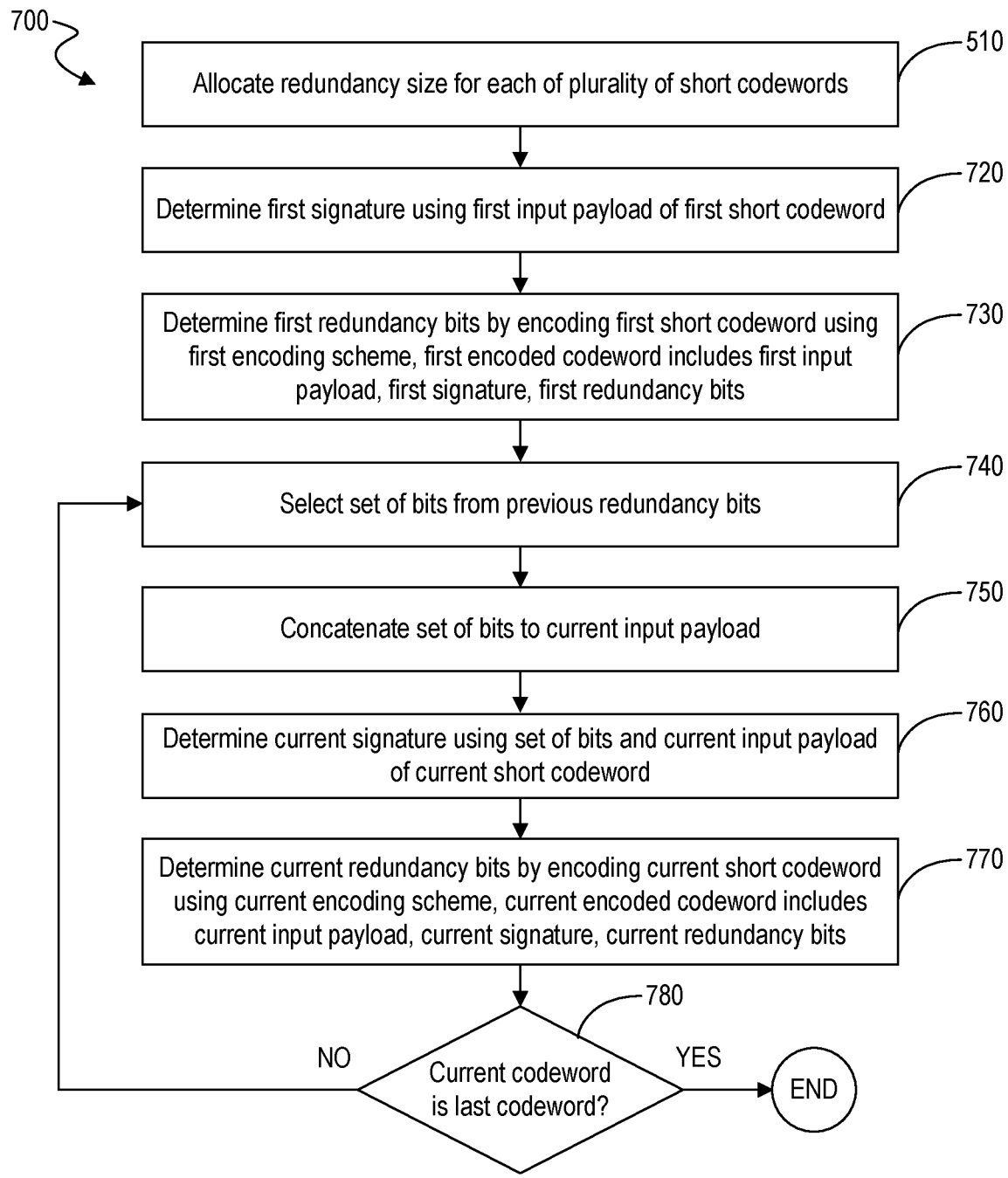
FIG. 7 is a process flow diagram illustrating an example encoding method, according to some implementations.

In some arrangements, instead of selecting a set of bits from a previous encoded short codeword to be concatenated to an input payload for a next codeword, the set of bits to be concatenated to an input payload for a next codeword can be selected from the redundancy bits. In that regard, FIG. 7 is a process flow diagram illustrating an example encoding method 700, according to some implementations. FIG. 8 is a diagram illustrating an example codeword structure 800 used for the encoding method 700 of FIG. 7, according to some implementations. Referring to FIGS. 1-8, the encoding method 700 is an example implementation of block 210, and can be performed by one or more encoders of the encoder/decoder 102 or 112.

At 510, the ECC encoder/decoder 102 or 112 allocates a redundancy size for each of a plurality of short codewords, as described with reference to FIG. 5. As shown in the codeword structure 800, the total input payload is the sum of a first input payload 802, a second input payload 812, a third input payload 822, . . . , an nth input payload 842. Each of the input payloads 802, 812, 822, . . . , and 842 includes information bits. The long codeword corresponds to the concatenated plurality of short codewords.

At 720, the ECC encoder/decoder 102 or 112 determines a first signature (e.g., signature bit(s) D1 803) using the first input payload 802 of a first short codeword of the plurality of short codewords. The first short codeword includes the first input payload 802 and D1 803. An example of D1 803 is extra CRC bits.

At 730, the ECC encoder/decoder 102 or 112 determines first redundancy bits Ra 804 by encoding the first short codeword using a first encoding scheme. Examples of the first encoding scheme include but are not limited to, the HFPC encoding scheme described herein, or another suitable encoding scheme. For example, the first short codeword corresponds to the input bits 301 or 501, including the first input payload 802 (e.g., the input payload 302 or 402) and D1 803 (e.g., D1 303 or 503). The input bits corresponding to the first short codeword can be arranged in the pseudo triangular matrix 310 or 410 to determine the Ra 804. In some examples, Ra 804 includes R1 341-Rn 345. In some examples, Ra 804 includes R1 461-R4 464. In that regard, a first encoded short codeword 801 includes the first input payload 602, D1 603, and R1 604.

At 740, the ECC encoder/decoder 102 or 112 selects, from a previous redundancy bits (e.g., Ra 804), a set of bits (e.g., a first set of bits Pa 806). In one example, the ECC encoder/decoder 102 or 112 can include a fixed mapper or a successive encoder mapper 805 to select Pa 806.

At 750, the ECC encoder/decoder 102 or 112 concatenates the sets of bits (e.g., Pa 806) to a current input payload (e.g., the second input payload 812) of a current (second) short codeword of the plurality of short codewords.

At 760, the ECC encoder/decoder 102 or 112 determines a current (second) signature (e.g., signature bit(s) D2 813) using the sets of bits (e.g., P1 806) and the current input payload (e.g., the second input payload 812). The second short codeword includes the second input payload 812 and D2 813.

At 770, the ECC encoder/decoder 102 or 112 determines current (second) redundancy bits (e.g., the redundancy bits Rb 814) by encoding the current (second) short codeword using a current (second) encoding scheme. Examples of the second encoding scheme include but are not limited to, the HFPC encoding scheme described herein, or another suitable encoding scheme. For example, the second short codeword corresponds to the input bits 301 or 501, including the second input payload 812 (e.g., the input payload 302 or 402) and D2 813 (e.g., D1 303 or 503). The input bits corresponding to the short codeword can be arranged in the pseudo triangular matrix 310 or 410 to determine the Rb 814. In some examples, Rb 814 includes R1 341-Rn 345. In some examples, Rb 814 includes R1 461-R4 464. In that regard, in some arrangements, a current (second) encoded short codeword 811 includes the second input payload 812, D2 813, and Rb 814. In other arrangements, the current (second) encoded short codeword 811 includes the second input payload 812, D2 813, and Rb 814, as well as Pa 806.

At 780, the ECC encoder/decoder 102 or 112 determines whether the current codeword is the last codeword of the plurality of codewords. In response to determining that the current codeword is not the last codeword (B780:NO), the method 700 returns to block 740. On the other hand, in response to determining that the current codeword is the last codeword (B780:YES), the method 700 ends.

In the example in which the current codeword is the second codeword (B780:NO), at 740, the ECC encoder/decoder 102 or 112 selects, from a previous redundancy bits (e.g., Ra 814), a set of bits (e.g., a second set of bits Pb 816). In one example, the ECC encoder/decoder 102 or 112 can include a fixed mapper or a successive encoder mapper 815 to select Pb 816. At 750, the ECC encoder/decoder 102 or 112 concatenates the sets of bits (e.g., Pb 816) to a current input payload (e.g., the third input payload 822) of a current (third) short codeword of the plurality of short codewords.

At 860, the ECC encoder/decoder 102 or 112 determines a current (third) signature (e.g., signature bit(s) D3 823) using the sets of bits (e.g., Pb 816) and the current input payload (e.g., the third input payload 822). The third short codeword includes the third input payload 822 and D3 823. At 870, the ECC encoder/decoder 102 or 112 determines current (third) redundancy bits (e.g., the redundancy bits Rc 824) by encoding the current (third) short codeword using a current (third) encoding scheme. Examples of the third encoding scheme include but are not limited to, the HFPC encoding scheme described herein, or another suitable encoding scheme. For example, the third short codeword corresponds to the input bits 301 or 501, including the third input payload 822 (e.g., the input payload 302 or 402) and D3 823 (e.g., D1 303 or 503). The input bits corresponding to the short codeword can be arranged in the pseudo triangular matrix 310 or 410 to determine the Rc 824. In some examples, Rc 824 includes R1 341-Rn 345. In some examples, Rc 824 includes R1 461-R4 464. In that regard, in some arrangements, a current (third) encoded short codeword 821 includes the third input payload 822, D3 823, and Rc 824. In other arrangements, the current (third) encoded short codeword 821 includes the third input payload 822, D3 823, and Rc 824, as well as Pb 816.

In the example in which the current codeword is the nth short codeword (B780:YES), the method 700 ends. The nth short codeword includes the nth input payload 842 and signature bit(s) Dn 843. Dn 843 is determined using the nth input payload 842 concatenated with the sets of bits Pn−1 836 in the manner described. Pn−1 836 can be selected the by a fixed mapper or a successive encoder mapper of the ECC encoder/decoder 102 or 112 from previous redundancy bits determined for the previous codeword. An example of Dn 843 is extra CRC bits. Redundancy bits Rn 844 is determined by encoding the nth short codeword using a nth encoding scheme. Examples of the nth encoding scheme include but are not limited to, the HFPC encoding scheme described herein, or another suitable encoding scheme. In that regard, in some arrangements, an nth encoded short codeword 841 includes the nth input payload 842, Dn 843, and Rn 844. In other arrangements, the nth encoded short codeword 841 includes nth input payload 842, Dn 843, and Rn 844, as well as Pn−1 836.

Encoding using the HFPC encoding scheme to determine each of the redundancy bits Ra 804, Rb 814, Rc 824, . . . , Rn 844 correspond to degree-one encoding. By concatenating redundancy bits of previous short codeword to payload bits of a next short codeword, degree-two encoding is provided. Each of the plurality of short codewords has a different code rate. The first codeword has the lowest code rate. The second codeword has a code rate higher than that of the first codeword. The third codeword has a code rate higher than that of the second codeword. The nth codeword has the highest code rate among the plurality of codewords.

With respect to decoding at block 220, the ECC encoder/decoder 102 or 112 decodes the encoded short codewords using one or more of decoding methods, examples of which include but are not limited to, partial decoding, successive decoding, and joint decoding.

Partial decoding can be performed for hard or soft decoding, and has capabilities that correspond to short-codeword code rate. For a partial decoding operation in which a number of bits (e.g., 4 KB) is decoded, only encoded data (e.g., concatenated bits from a previous codeword, such as but not limited to, P1 606, P2 616, . . . , Pn−1 636 and Pa 806, Pb 816, . . . , Pn−1 836) associated with an encoded target codeword (and not the encoded target codeword itself) is read. The encoded target codeword has a size corresponding to the number of bits. In partial decoding, the decoders of the ECC encoder/decoder 102 or 112 decodes the encoded data standalone. In the examples in which the redundancy size for each of the plurality of short codewords is the same as the number of bits (e.g., 4 KB), partial decoding allow a decoder to operate on only the encoded target codeword at a time. The capabilities of partial decoding is therefore commensurate with standalone decoding at the number of bits. The decoders of ECC encoder/decoder 102 or 112 needs to input only the bits of the encoded data associated with the encoded target codeword.

In partial decoding, only bits of a short codeword are read from the memory array 120 and decoded. Partial decoding allows read performance and decoding complexity to be minimal. Partial decoding can be employed in a reading/decoding operation as long as the BER level is within the error correction capabilities of the short codeword. As described, in some examples, although each short codeword is allocated redundancy bits equal to 1/n of the total number of bits of the data (each short codeword includes a same size of input payload before concatenation), the code rate of a subsequent codeword is higher than the code rate of a previous codeword. In that regard, although the capabilities of partial decoding may be reduced for decoding the encoded short codewords 611, 621, . . . , 641 and 811, 821, . . . , 841, the decoding capabilities of partial decoding employed to decode the first encoded short codewords 601 and 801 is stronger, given that the first encoded short codewords 601 and 801 have a lower code rate as compared to that of the subsequent encoded short codewords 611, 621, . . . , 641 and 811, 821, . . . , 841. In other words, given that the code rate of the encoded short codeword 601 or 801 may correspond to a code rate of the long codeword (formed by concatenating the short codewords), the encoded short codeword 601 or 801 has decoding capabilities stronger than those of the subsequent encoded short codewords 611, 621, . . . , 641 or 811, 821, . . . , 841, respectively.

Figure 9:
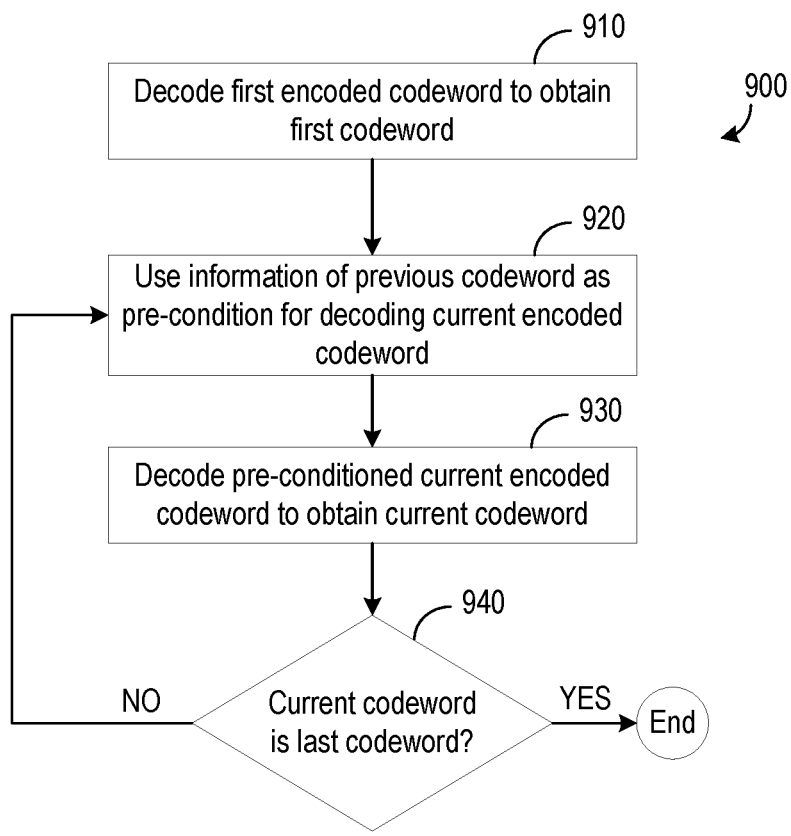
FIG. 9 is a process flow diagram illustrating an example successive decoding method, according to some implementations.

In some arrangements, successive decoding is employed to provide decode capabilities close to that of the first short codeword (e.g., the encoded short codeword 601 or 801). FIG. 9 is a process flow diagram illustrating an example successive decoding method 900, according to some implementations. Referring to FIGS. 1-9, the successive decoding method 900 is an example implementation of block 220, and can be performed by one or more decoders of the ECC encoder/decoder 102 or 112.

At 910, the ECC encoder/decoder 102 or 112 decodes the first encoded short codeword (e.g., the encoded short codeword 601 or 801) to obtain the first codeword associated with the first encoded short codeword. Certain information (e.g., the bits for the entire first encoded short codeword 601 or the bits for Ra 804) can be determined.

At 920, the ECC encoder/decoder 102 or 112 uses the information of the previous codeword (e.g., the first codeword corresponding to the first encoded short codeword 601 or 801) as precondition for decoding the current encoded short codeword (e.g., the second encoded short codeword 611 or 811). The information (e.g., the bits for the entire first encoded short codeword 601 or the bits for Ra 804) can be used to determine the bits (e.g., P1 606 and Pa 805) concatenated to the next codeword (e.g., the second codeword), for example, by inputting the information into the successive encoder mapper 605 or 805 to determine P1 606 or Pa 805, respectively.

At 930, the ECC encoder/decoder 102 or 112 decodes the preconditioned current encoded short codeword to obtain the current codeword (e.g., the second codeword). That is, with the knowledge of shared bits such as P1 606 or Pa 805, the ECC encoder/decoder 102 or 112 can decode the second encoded short codeword 611 or 811, respectively.

At 940, the ECC encoder/decoder 102 or 112 determines whether the current codeword is the last codeword. In response to determining that the current codeword is the last codeword, such as those corresponding to the encoded short codewords 641 and 841, (940:YES), the method 900 ends.

On the other hand, in response to determining that the current codeword is not the last codeword (940:NO), the method 900 returns to block 920. In one example in which the current codeword is the second codeword obtained by decoding the second encoded short codeword 811 or 811, the method 900 returns to block 290, in which the information (e.g., the bits for the entire second encoded short codeword 611 or the bits for Rb 814) of the second codeword is used as precondition for decoding the third encoded short codeword 621 or 821, respectively.

In the method 900, every target encoded short codeword (e.g., have a redundancy size such as 4 KB) is decoded alone, as long as all previous encoded short codewords are successfully decoded. The decoding of each target encoded short codeword is standalone, and uses the known data of the shared/concatenated bits (P1 606, P2 616, . . . , Pn−1 636 and Pa 811, Pb 821, . . . , Pn−1 841). The decoding capabilities of successive decoding roughly corresponds to the those of standalone codewords having the same redundancy size (e.g., 4 KB) without the concatenated bits P1 606, P2 616, ..., or Pn–1 636, or without the concatenated bits Pa 806, Pb 816, ..., or Pn–1 836.

Successive decoding of a current short codeword includes reading from the memory array 120 only the total number of previous short codewords before the current short codeword (and not the long codeword). In that regard, successive decoding has decoding complexity that is exactly the total number of previous short codewords multiplied by the decoding complexity of one short codeword. In that regard, for a given short codeword read, the number of short codewords to read and decode is, on average, $$\frac{(n+1)}{2}.$$

Successive decoding has low decoding complexity (which is on the scale of a short-codeword) and needs, per short codeword, only resources of that short codeword without needing information associated with the long codeword or other short-codewords (except for the known decoded bits of the previous short codewords).

In some arrangements, in response to determining that successive decoding of one of the plurality of encoded short codeword fails, joint decoding of the encoded short codewords can be performed. Joint decoding corresponds to long-codeword decoding (e.g., joint decoding of the short codewords within the long-codeword). In the examples in which each of the short codewords are encoded using the HFPC scheme, the decoders of the ECC encoder/decoder 102 or 112 can perform joint iterative decoding of the encoded short codewords and pass partial decoding results between each of the short codewords per iteration, until decoding succeeds for the target codeword.

In other words, joint decoding refers to all of the encoded short codewords are being used in jointly iterative decoding, which has decoding capabilities of approximately that of a long codeword. In joint decoding, all of the encoded short codewords 601, 611, 621, ..., and 641, or 801, 811, 821, ..., and 841 are read from the memory array 120 and processed together to improve decode success rate that correspond to that of a long codeword (composed of the short codewords).

In the example in which a long codeword (e.g., having a redundancy size of 16 KB) is encoded using a number (e.g., 4) short codewords (each having a redundancy size of 4 KB having a code rate of 0.87), Applicant recognizes that the capabilities of partial decoding of first encoded short codeword (e.g., the encoded short codeword 601 or 801) and the capabilities of successive decoding all other encoded short codewords (e.g., the encoded short codewords 611, 621, ..., 641 and 811, 821, ..., 841) are similar, given that successive decoding allows each encoded short codeword to be decoded conditioned on clean (decoded) bits of a previous codeword, effectively providing a lower code rate as the known bits do not need to be decoded again. Thus, each short codeword decoding has the same characteristic codewords that operate on same code rates of the conditional short codewords.

In that regard, in response to determining that the first decoding method (e.g., partial decoding) of the decoding methods fails, a second decoding method (e.g., successive decoding) of the decoding methods is used to decode remaining ones the plurality of short codewords (that have not been decoded by the first decoding method). In response to determining that the second decoding method fails, a third decoding method (e.g., joint decoding) of the decoding methods is used to decode remaining ones the plurality of short codewords (that have not been decoded by the first and second decoding methods).

In some arrangements, the first decoding method (e.g., partial decoding) is used to decode the first encoded short codewords (the encoded short codeword 601 or 801), and the second decoding method (e.g., successive decoding) is used to decode the other encoded short codewords (e.g., the encoded short codewords 611, 621, ..., 641 and 811, 821, ..., 841). In response to determining that the second decoding method fails, a third decoding method (e.g., joint decoding) of the decoding methods is used to decode remaining ones the plurality of short codewords (that have not been decoded by the first and second decoding methods).

In some arrangements, the one or more decoders of the ECC encoder/decoder 102 or 112 can select whether to perform one or more of the partial decoding, successive decoding, or joint decoding of the concatenated short codewords in one or hard decoding or soft decoding modes based on one or more of read-flow optimization of tail latency distribution, NAND stress condition(s), and so on. In some examples, hard decoding may be preferred as it needs only a single read from the NAND memory devices 130a-130n and has a fast decoding implementation as well as a small latency. However, the decoding capability of hard decoding is limited. If the BER increases, hard decoding may fail. Thus, for successful recovery of data at high BER, soft decoding may be needed. For soft decoding, the controller 110 needs to obtain high resolution information per bit from the NAND memory devices 130a-130n by performing multiple reads. These multiple reads increase the latency of the controller 110 and the associated decoding may also take a longer period of time, thus increasing the system latency. Stress conditions such as high retention and high read-disturb are typical cases in which the BER increases and thus needing to activate soft decoding. In optimizing latency tail, it is preferable that the probability for high latency read operations is low. Table I, below, demonstrates a common SSD specification in which the average latency per host request and its maximal value distribution are specified. The read flow can therefore be designed to use decoding tools with gradually increasing latency corresponding to gradually increasing reliability, e.g., reading the concatenated long codeword with joint soft iterative decoding should be performed at low probability as joint soft iterative decoding has a long latency.

TABLE I

Latency Tail Distribution

| Probability | Maximum Latency (μs) |
|---|---|
| Average | 240 |
| 90% | — |
| 99% | 300 |
| 99.9% | 400 |
| 99.99% | 500 |
| 99.999% | 1000 |
| 99.9999% | 3000 |
| 99.99999% | 5000 |
| 99.999999% | 7000 |
| Up to full | 11000 |

Figure 10:
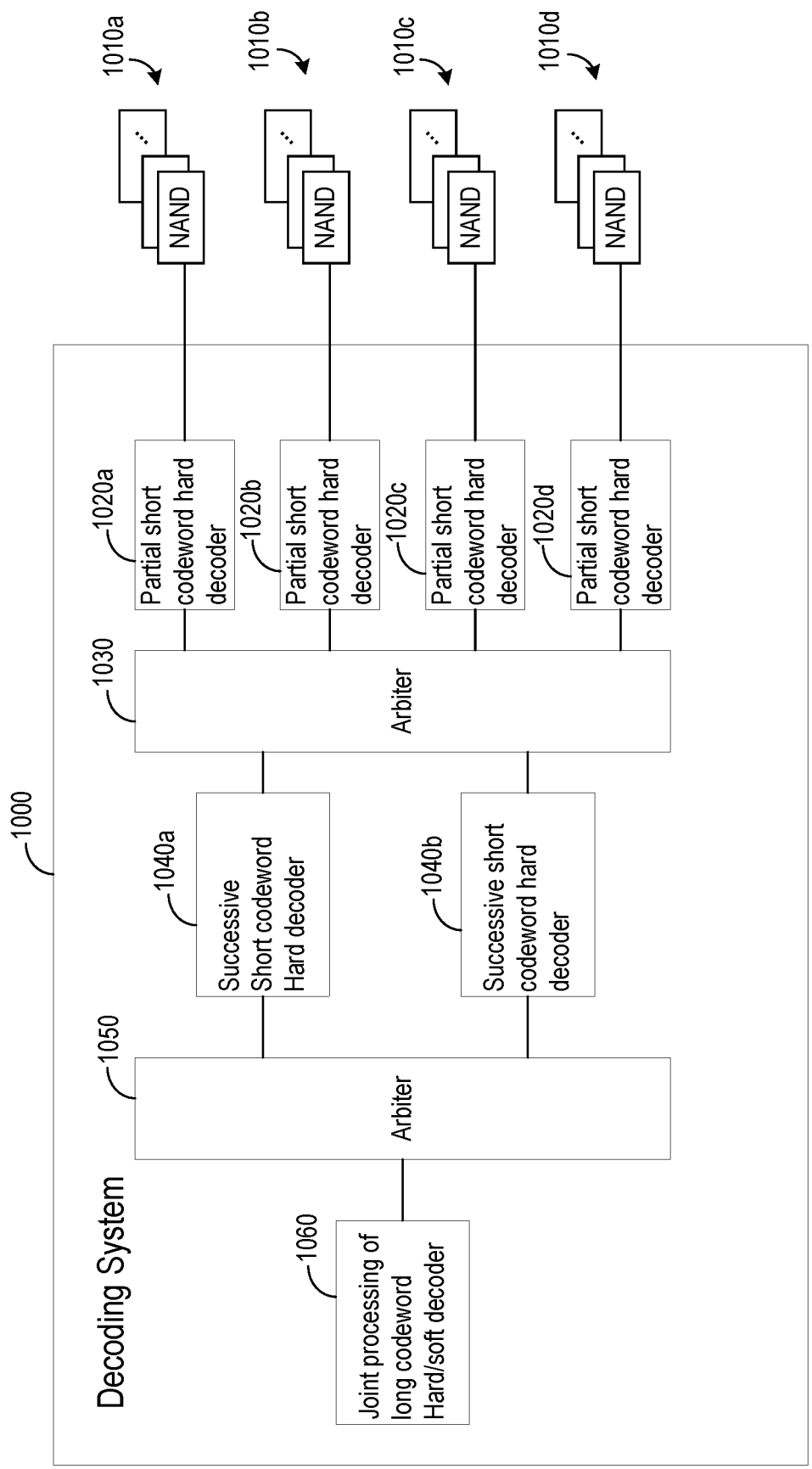
FIG. 10 is a block diagram illustrating an example decoding system communicably coupled to NAND flash memory devices, according to some implementations.

In some arrangements, decoding at block 220 can be designed based on latency distribution optimization according to the decoding latency distribution of the different decoding methods and the hardware implementation cost for the decoding methods. In that regard, FIG. 10 is a block diagram illustrating an example decoding system 1000 communicably coupled to NAND flash memory devices 1010a-1010d, according to some implementations. Referring to FIGS. 1-10, the decoding system 1000 corresponds to the decoding functionalities of the ECC encoder/decoder 102 or 112. Each of the components of the decoding system 1000 can be implemented on software, hardware, or firmware on the host 101 or the controller 110. In some examples, each of the components of the decoding system 1000 can be implemented on separate hardware (e.g., separate processing circuits).

In some examples, the NAND flash memory devices 130a-130n include NAND flash memory devices 1010a-1010d. The NAND flash memory devices 1010a-1010d are communicable coupled to respective ones of partial short codeword hard decoders 1020a-1020d via suitable hardware or software communication channels. The partial short codeword hard decoders 1020a-1020d receive the encoded short codewords from the NAND flash memory devices 1010a-1010d via the communication channels, and perform hard partial decoding on the encoded short codewords.

In the example shown in FIG. 10, the partial short codeword hard decoders 1020a-1020d can succeed with partial hard decoding. In some cases in which the read thresholds are not matched to the NAND conditions in the NAND flash memory devices 1010a-1010d, there may be a low likelihood that partial hard decoding may fail. In response to detecting the failure, the decoding system 1000 assigns one of successive short codeword hard decoders 1040a or 1040b to decode the encoded short codeword for which decoding has failed. For example, an arbiter 1030 is a multiplexer arbiter can route or otherwise connect one of the successive short codeword hard decoders 1040a or 1040b to a corresponding one of the NAND flash memory devices 1010a-1010d in which the failed encoded short codeword is stored, to allow the one of the successive short codeword hard decoders 1040a or 1040b to read that failed encoded short codeword. The one of the successive short codeword hard decoders 1040a or 1040b can perform successive hard decoding on that encoded short codeword. The decoding system 1000 includes two successive short codeword hard decoders 1040a or 1040b given that successive decoding has longer latencies.

The successive hard decoding of the encoded short codewords has a very low likelihood of failing. In response to determining that successive hard decoding of an encoded short codeword has failed, an arbiter 1050 is a multiplexer arbiter can route or otherwise connect one of a joint processing of long codeword hard/soft decoder 1060 to a corresponding one of the NAND flash memory devices 1010a-1010d in which the failed encoded short codeword is stored, to allow the joint processing of long codeword hard/soft decoder 1060 to read that failed encoded short codeword. The joint processing of long codeword hard/soft decoder 1060, which has the highest reliability, can perform hard or soft joint decoding on the encoded long codeword containing the failed encoded short codeword.

Figure 11:
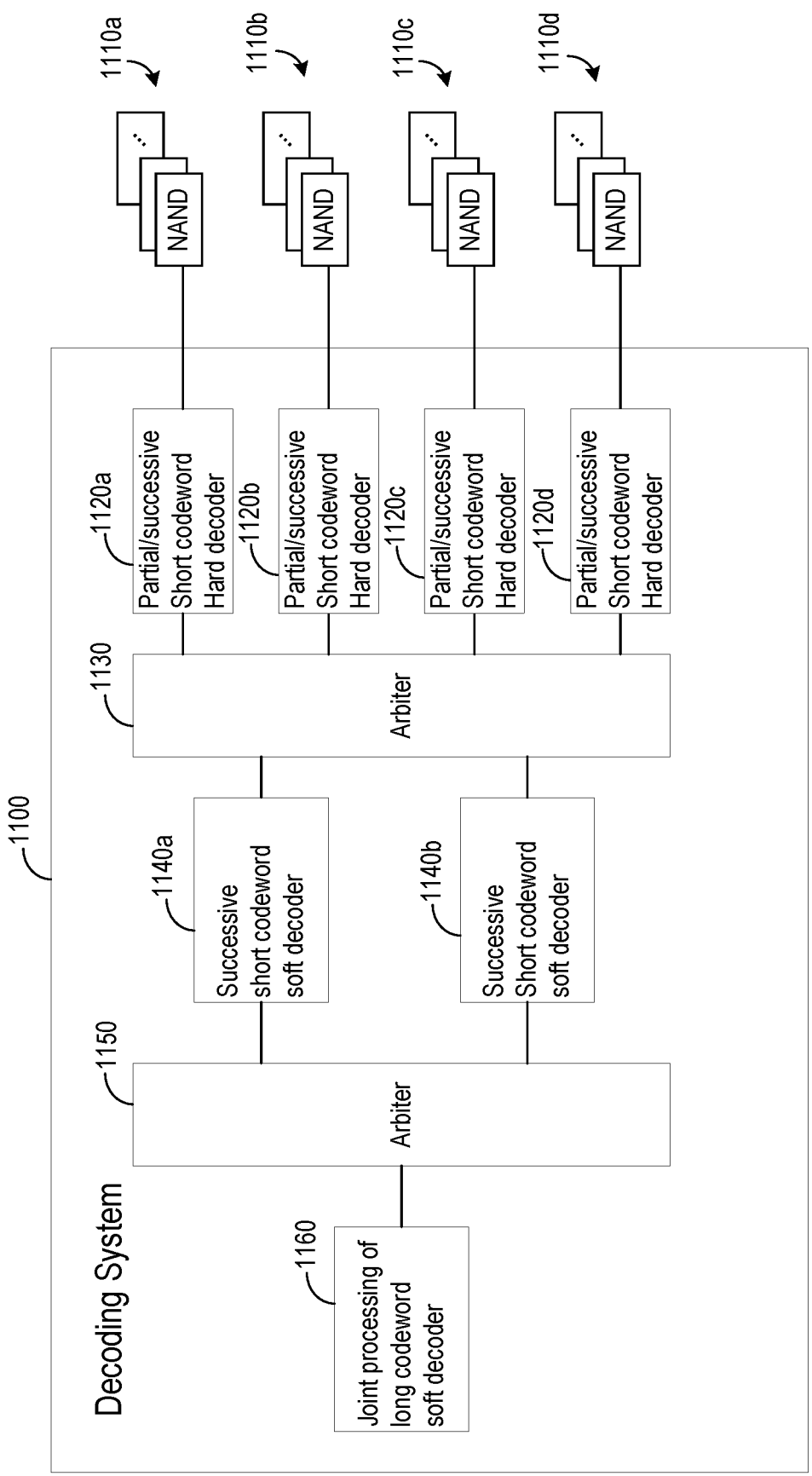
FIG. 11 is a block diagram illustrating an example decoding system communicably coupled to NAND flash memory devices, according to some implementations.

In other arrangements, channel decoders, each of which is coupled to a channel, have capabilities for both partial hard decoding and successive hard decoding. In that regard, FIG. 11 is a block diagram illustrating an example decoding system 1100 communicably coupled to NAND flash memory devices 1110a-1110d, according to some implementations. Referring to FIGS. 1-11, the decoding system 1100 corresponds to the decoding functionalities of the ECC encoder/decoder 102 or 112. Each of the components of the decoding system 1100 can be implemented on software, hardware, or firmware on the host 101 or the controller 110. In some examples, each of the components of the decoding system 1100 can be implemented on separate hardware (e.g., separate processing circuits).

In some examples, the NAND flash memory devices 130a-130n include NAND flash memory devices 1110a-1110d. The NAND flash memory devices 1110a-1110d are communicable coupled to respective ones of partial/successive short codeword hard decoders 1120a-1120d via suitable hardware or software communication channels. The partial/successive short codeword hard decoders 1120a-1120d receive the encoded short codewords from the NAND flash memory devices 1110a-1110d via the communication channels, and perform hard partial/successive decoding on the encoded short codewords. The partial/successive short codeword hard decoders 1120a-1120d correspond to hardware that is used for partial hard decoding and for successive hard decoding. In some examples, in response to determining that hard partial decoding has failed with respect to an encoded codeword, the partial/successive short codeword hard decoders 1120a-1120d uses successive hard decoding to decode the failed encoded codeword.

In response to detecting that both partial hard decoding and successive hard decoding have failed, the decoding system 1100 assigns one of successive short codeword soft decoders 1140a or 1140b to decode the encoded short codeword for which decoding has failed. For example, an arbiter 1130 is a multiplexer arbiter can route or otherwise connect one of the successive short codeword soft decoders 1140a or 1140b to a corresponding one of the NAND flash memory devices 1110a-1110d in which the failed encoded short codeword is stored, to allow the one of the successive short codeword soft decoders 1140a or 1140b to read that failed encoded short codeword. The one of the successive short codeword soft decoders 1140a or 1140b can perform successive soft decoding on that encoded short codeword. The decoding system 1100 includes two successive short codeword soft decoders 1140a or 1140b given that successive decoding has longer latencies.

The successive soft decoding of the encoded short codewords has a very low likelihood of failing. In response to determining that successive soft decoding of an encoded short codeword has failed, an arbiter 1150 is a multiplexer arbiter can route or otherwise connect one of a joint processing of long codeword soft decoder 1160 to a corresponding one of the NAND flash memory devices 1110a-1110d in which the failed encoded short codeword is stored, to allow the joint processing of long codeword soft decoder 1160 to read that failed encoded short codeword. The joint processing of long codeword soft decoder 1160, which has the highest reliability, can perform soft joint decoding on the encoded long codeword containing the failed encoded short codeword.

Figure 12:
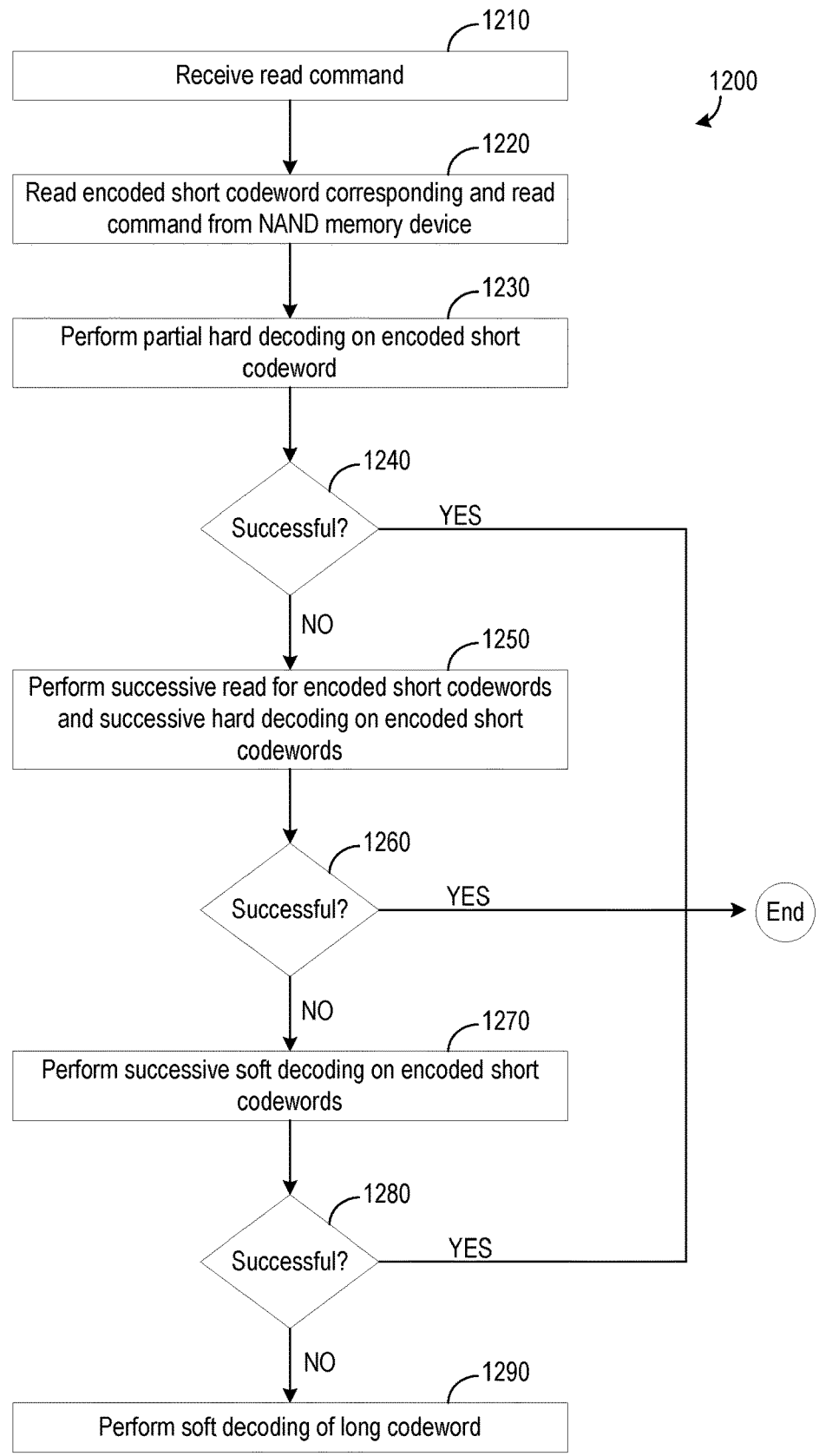
FIG. 12 is a process flow diagram illustrating an example decoding method, according to some implementations.

FIG. 12 is a process flow diagram illustrating an example decoding method 1200, according to some implementations. Referring to FIGS. 1-12, the method 1200 is a part of a read flow that uses the decoding system 1000 or 1100 to optimize a latency quality-of-service (QoS) distribution while providing highest combination of endurance and reliability.

At 1210, a read command for data corresponding to a given redundancy size (e.g., 4 KB) is received by the decoding system 1000 or 1100. At 1220, the decoding system 1000 or 1100 (e.g., one the partial short codeword hard decoder 1020a-1020d or one of the partial/successive short codeword hard decoder 1120a-1120d) reads a target encoded short codeword corresponding to the read command from NAND memory devices 1010a-1010d or 1110a-1110d.

At 1230, the decoding system 1000 or 1100 (e.g., the one of the partial short codeword hard decoder 1020a-1020d or the one of the partial/successive short codeword hard decoder 1120a-1120d) performs partial hard decoding on the encoded target short codeword. In response to determining that partial hard decoding on the encoded target short codeword is successful (1240:YES), the method 1200 ends. On the other hand, in to determining that partial hard decoding on the encoded target short codeword fails (1240: NO), the decoding system 1000 or 1100 (e.g., one of the successive short codeword hard decoder 1040a-1040d or the one of the partial/successive short codeword hard decoder 1120a-1120d) performs successive read for encoded short codewords (including the target short codeword and previous short codewords to the target short codeword) and perform successive hard decoding on the encoded short codewords, at 1250.

In response to determining that successive hard decoding on the encoded short codewords is successful (1260:YES), the method 1200 ends. On the other hand, in to determining that successive hard decoding on the encoded short codewords fails (1260:NO), the decoding system 1100 (e.g., the successive short codeword soft decoder 1140a or 1140b) performs successive soft decoding on the encoded short codewords at 1270. The encoded short codewords include the target short codeword and previous short codewords to the target short codeword.

In response to determining that successive soft decoding on the encoded short codewords is successful (1280:YES), the method 1200 ends. On the other hand, in to determining that successive soft decoding on the encoded short codewords fails (1280:NO), the decoding system 1000 or 1100 (e.g., the joint processing of long codeword hard/soft decoder 1060 or the joint processing of long codeword soft decoder 1160) can perform soft decoding of the long codeword, at 1290. The long codeword includes short codewords, which include the target short codeword.

Accordingly, the codeword concatenation scheme described herein leverages characteristics of long codewords to provide high read performance (e.g., high read throughput). Furthermore, the codeword concatenation scheme enables high endurance and improved resilience to retention and read-disturb stresses. In addition, the codeword concatenation scheme benefits from not only the decode reliability of a very-long codeword, but also read/decode complexity of short codewords.

Further disclosure of the HFPC ECC structure and decoding scheme related thereto can be found in U.S. patent application Ser. No. 16/355,559, titled "Error Correction Code Decoder," filed on Mar. 15, 2019, and U.S. patent application Ser. No. 16/355,555, titled "Decoding Scheme for Error Correction Code Structure," filed on Mar. 15, 2019, the entire contents of which are hereby incorporated by reference. Further disclosure of soft decoding using the HFPC scheme can be found in U.S. patent application Ser. No. 16/843,744, titled "Decoding Scheme for Error Correction Code Structure in Data Storage Devices," filed on Apr. 8, 2020, the entire content of which are hereby incorporated by reference.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for encoding and decoding data having input payload stored in a non-volatile storage device, comprising:
encoding the input payload by concatenating a plurality of short codewords to generate a plurality of encoded short codewords, each of the plurality of short codewords corresponding to a portion of the input payload, wherein each of the plurality of short codewords has a different code rate; and
decoding the plurality of encoded short codewords to obtain the data.

2. The method of claim 1, wherein generating the long codeword by concatenating the plurality of short codewords comprises:
determining a first signature using a first input payload of a first short codeword of the plurality of short codewords, the first short codeword comprises the first input payload and the first signature;
determining first redundancy bits by encoding the first short codeword using a first encoding scheme, a first encoded short codeword comprises the first input payload, the first signature, and the first redundancy bits;
selecting, from the first encoded short codeword, a first set of bits;
concatenating the first set of bits to a second input payload of a second short codeword of the plurality of short codewords;
determining a second signature using the first set of bits and the second input payload, the second short codeword comprises the second input payload and the second signature; and
determining second redundancy bits by encoding the second short codeword using a second encoding scheme, a second encoded short codeword comprises the second input payload, the second signature, and the second redundancy bits.

3. The method of claim 2, wherein generating the long codeword by concatenating the plurality of short codewords further comprises:
selecting, from the second encoded short codeword, a second set of bits;
concatenating the second set of bits to a third input payload of a third short codeword of the plurality of short codewords;
determining a third signature using the second set of bits and the third input payload, the third short codeword comprises the third input payload and the third signature; and
determining third redundancy bits by encoding the third short codeword using a third encoding scheme, a third encoded short codeword comprises the third input payload, the third signature, and the third redundancy bits.

4. The method of claim 2, wherein each of the first signature and the second signature is a cyclic redundancy check-sum (CRC).

5. The method of claim 2, wherein
the first codeword has a first code rate;
the second codeword has a second code rate; and
the second code rate is higher than the first code rate.

6. The method of claim 2, wherein each of the encoding scheme and the second encoding scheme is a half folded-product code (HFPC) encoding scheme.

7. The method of claim 1, wherein generating the long codeword by concatenating the plurality of short codewords comprises allocating a redundancy size for each of the plurality of short codewords.

8. The method of claim 7, wherein the redundancy size for each of the plurality of short codewords is a total redundancy size of the long codeword divided by a number of the plurality of short codewords.

9. The method of claim 1, wherein generating the long codeword by concatenating the plurality of short codewords comprises:
  determining a first signature using a first input payload of a first short codeword of the plurality of short codewords, the first short codeword comprises the first input payload and the first signature;
  determining first redundancy bits by encoding the first short codeword using a first encoding scheme, a first encoded short codeword comprises the first input payload, the first signature, and the first redundancy bits;
  selecting, from the first redundancy bits, a first set of bits;
  concatenating the first set of bits to a second input payload of a second short codeword of the plurality of short codewords;
  determining a second signature using the first set of bits and the second input payload, the second short codeword comprises the second input payload and the second signature; and
  determining second redundancy bits by encoding the second short codeword using a second encoding scheme, a second encoded short codeword comprises the second input payload, the second signature, and the second redundancy bits.

10. The method of claim 1, wherein the plurality of encoded short codewords is decoded using one or more of decoding methods, the decoding methods comprise partial decoding, successive decoding, and joint decoding.

11. The method of claim 10, wherein decoding the plurality of encoded short codewords comprises:
  decoding the plurality of encoded short codewords using a first decoding method of the decoding methods;
  in response to determining that the first decoding method fails, decoding the plurality of encoded short codewords using a second decoding method of the decoding methods; and
  in response to determining that the second decoding method fails, decoding the plurality of encoded short codewords using a third decoding method of the decoding methods.

12. The method of claim 10, wherein decoding the plurality of encoded short codewords comprises determining whether to perform the one or more of the decoding methods in a hard decoding mode or a soft decoding mode based on one or more of tail latency distribution or NAND stress condition of the non-volatile storage device.

13. An error correction system, comprising:
  a processing circuit configured to encode and decode data having input payload stored in a non-volatile storage device by:
    encoding the input payload by concatenating a plurality of short codewords to generate a plurality of encoded short codewords, each of the plurality of short codewords corresponding to a portion of the input payload, wherein each of the plurality of short codewords has a different code rate; and
    decoding the plurality of encoded short codewords to obtain the data.

14. The error correction system of claim 13, wherein the processing circuit generates the long codeword by:
  determining a first signature using a first input payload of a first short codeword of the plurality of short codewords, the first short codeword comprises the first input payload and the first signature; determining first redundancy bits by encoding the first short codeword using a first encoding scheme, a first encoded short codeword comprises the first input payload, the first signature, and the first redundancy bits;
  selecting, from the first encoded short codeword, a first set of bits;
  concatenating the first set of bits to a second input payload of a second short codeword of the plurality of short codewords;
  determining a second signature using the first set of bits and the second input payload, the second short codeword comprises the second input payload and the second signature; and
  determining second redundancy bits by encoding the second short codeword using a second encoding scheme, a second encoded short codeword comprises the second input payload, the second signature, and the second redundancy bits.

15. The error correction system of claim 14, wherein each of the encoding scheme and the second encoding scheme is a half folded-product code (HFPC) encoding scheme.

16. The error correction system of claim 13, wherein the plurality of encoded short codewords is decoded using one or more of decoding methods, the decoding methods comprise partial decoding, successive decoding, and joint decoding.

17. The error correction system of claim 16, wherein the processing circuit decodes the plurality of encoded short codewords by:
  decoding the plurality of encoded short codewords using a first decoding method of the decoding methods;
  in response to determining that the first decoding method fails, decoding the plurality of encoded short codewords using a second decoding method of the decoding methods; and
  in response to determining that the second decoding method fails, decoding the plurality of encoded short codewords using a third decoding method of the decoding methods.

18. A non-transitory computer-readable medium storing computer-readable instructions, such that when executed, causes a processing circuit to:
  encode an input payload by concatenating a plurality of short codewords to generate a plurality of encoded short codewords, each of the plurality of short codewords corresponding to a portion of the input payload, wherein each of the plurality of short codewords has a different code rate; and
  decode the plurality of encoded short codewords to obtain the data.

* * * * *